United States Patent [19]
Clarkson et al.

[11] Patent Number: 5,825,551
[45] Date of Patent: Oct. 20, 1998

[54] BEAM SHAPER

[75] Inventors: William Andrew Clarkson, Southampton, United Kingdom; Anthony Brian Neilson, Glenhuntly, Australia; David Colin Hanna, Southampton, United Kingdom

[73] Assignee: The University of Southampton, United Kingdom

[21] Appl. No.: 346,153

[22] Filed: Nov. 29, 1994

[30] Foreign Application Priority Data

Nov. 30, 1993 [GB] United Kingdom .................. 9324589

[51] Int. Cl.$^6$ ............................ G02B 27/14; G02B 5/08
[52] U.S. Cl. ......................... 359/629; 359/636; 359/637; 359/855; 359/856; 359/857
[58] Field of Search .................... 359/855, 856, 359/857, 629, 636, 637

[56] References Cited

U.S. PATENT DOCUMENTS

| | | |
|---|---|---|
| 4,520,472 | 5/1985 | Reno . |
| 5,080,474 | 1/1992 | Miyamoto .............................. 359/710 |
| 5,080,706 | 1/1992 | Snyder et al. . |
| 5,127,068 | 6/1992 | Baer et al. . |
| 5,155,631 | 10/1992 | Snyder et al. . |
| 5,168,401 | 12/1992 | Endriz . |
| 5,224,200 | 6/1993 | Rasmussen et al. . |
| 5,258,989 | 11/1993 | Raven . |
| 5,299,222 | 3/1994 | Shannon et al. . |
| 5,343,489 | 8/1994 | Wangler .................................. 372/93 |

FOREIGN PATENT DOCUMENTS

| | | |
|---|---|---|
| 279 932 A1 | 8/1988 | European Pat. Off. . |
| 353 853 A1 | 2/1990 | European Pat. Off. . |
| 484 276 A1 | 5/1992 | European Pat. Off. . |
| 525 528 A1 | 7/1992 | European Pat. Off. . |
| 2615173 | 11/1977 | Germany . |
| 2 256 503 B | 1/1994 | United Kingdom . |
| 2 261 528 B | 4/1994 | United Kingdom . |
| 90/00752 | 1/1990 | WIPO . |
| 91/12641 | 8/1991 | WIPO . |
| 92/02844 | 2/1992 | WIPO . |

OTHER PUBLICATIONS

University of Southampton et al., PCT Search Report for PCT/GB94/02614.
J. Berger et al., "Fiber–bundle coupled, diode end–pumped Nd:YAG laser", *Optics Letters*, vol. 13, No. 4, pp. 306–308, Apr. 1988.
W.A. Clarkson et al., "Novel beam shaping technique for high–power diode bars", *CLEO '94*, p. 360, May 12, 1994.
H. Zellmer et al., "High power single–frequency operation of continuous wave diode–pumped Nd:YAG ring lasers", *CLEO/EUROPE '94*, pp. 410–411, 1994.
J. Forkner et al., "Characteristics of Efficient Laser Diode Collimators", *Melles Griot*, 1983.
D. Kuntz, "Specifying Laser Diode Optics", *Laser Focus/Elecro–Optics*, Mar. 1994.
J. Leger et al., "Geometrical Transformation of Linear Diode–Laser Arrays for Longitudinal Pumping of Solid–State Lasers", *IEEE Journal of Quntum Electronics*, vol. 28, No. 4, pp. 1088–1100, Apr. 1992.
J. Stagaman et al., "Laser diode to fiber coupling using anamorphic gradient–index lenses", *Applied Optics*, vol. 23, No. 11, pp. 1730–1734, Jun. 1, 1984.

*Primary Examiner*—Georgia Y. Epps
*Assistant Examiner*—Evelyn A. Lester
*Attorney, Agent, or Firm*—Renner, Otto, Boisselle & Sklar, P.L.L.

[57] ABSTRACT

A beam shaping device for a laser device is provided. The laser device has a beam with a first beam quality factor $M_x^2$ in a first direction, and a second beam quality factor $M_y^2$ in an orthogonal direction. The beam shaping device includes at least one reflecting surface diverting at least a first part of the beam in order to reconfigure at least one of the first and second beam qualities $M_x^2$ and $M_y^2$.

22 Claims, 9 Drawing Sheets

BEAM SHAPER

BACKGROUND OF THE INVENTION

1. Field of the Invention

This invention relates to beam shapers, and more particularly to beam shapers which may be used to change the transverse intensity distribution of a light beam such as a laser beam.

2. Description of Related Art

There are many applications of laser sources where a change in the transverse intensity distribution of the laser beam is desirable.

Often, these changes can be achieved in a relatively simple manner with conventional optical components (e.g. lenses, prisms and curved mirrors). However, for some laser devices (e.g. high power diode lasers), which have a highly elliptical and non-diffraction-limited output, the desired adjustment of laser beam size and shape may be difficult to achieve with conventional optical components alone.

One important example of this situation is where a high power diode bar is used to longitudinally-pump (end-pump) a solid-state laser. Longitudinal pumping of a solid-state laser with a diode laser, as described in the article "Design Criteria For Mode Size Optimization In Diode-Pumped Solid-State Lasers", IEEE J. Quantum Electron, 27, 2319 (1991), is considered a particularly attractive and efficient way to pump a solid-state laser. In order to achieve the most desirable operating characteristics of the solid-state laser (e.g. low threshold, optimum efficiency and diffraction-limited fundamental transverse mode (so-called "TEM$_{oo}$"operation) it is necessary to have a relatively small laser mode area, and to focus the pump light into the laser medium so that the pump beam transverse dimensions are reasonably well matched to those of the fundamental transverse laser mode over the length of the laser medium or at least over a length approximately equal to the absorption length of the pump light in the laser medium (whichever is the shorter).

A measure of the ability to focus a laser beam to a particular size, whilst achieving the lowest possible beam divergence, is given by the so-called "M$^2$" parameter of the beam. This is described in the book "The Physics and Technology of Laser Resonators," (Adam Hilger, 1989). There, M$^2$ is defined as the number of times the beam's divergence exceeds the diffraction limit. It can be shown that the minimum average beam size to which a beam may be focused (over any particular length) is approximately proportional to M. Thus, in the case of longitudinal pumping of a solid state laser, the M value for the pump beam determines the minimum laser mode size (for TEM$_{oo}$ operation) and hence the maximum gain of the pumped laser.

M$^2$ is equal to 1 for a diffraction limited beam. For most laser sources M$^2$ is much greater than 1, and a decrease in M$^2$ represents an improvement in beam quality.

For some laser sources, and in particular high power diode lasers, the diffraction properties of the output beam are not cylindrically symmetrical about the beam propagation axis, and hence must be described by two different values for M$^2$ namely; M$_x^2$ and M$_y^2$ for orthogonal transverse directions x and y respectively.

The values for M$_x^2$ and M$_y^2$ can differ very significantly depending on the details of the laser design. Another contributing factor is that many high power diode lasers are themselves made up of an array of lower power diode lasers. In such cases, the combined output beams have M$_x^2$ and M$_y^2$ values which depend on the M$_x^2$ and M$_y^2$ values of the individual diode lasers and also on the relative spacings of the diodes.

Figure 1:
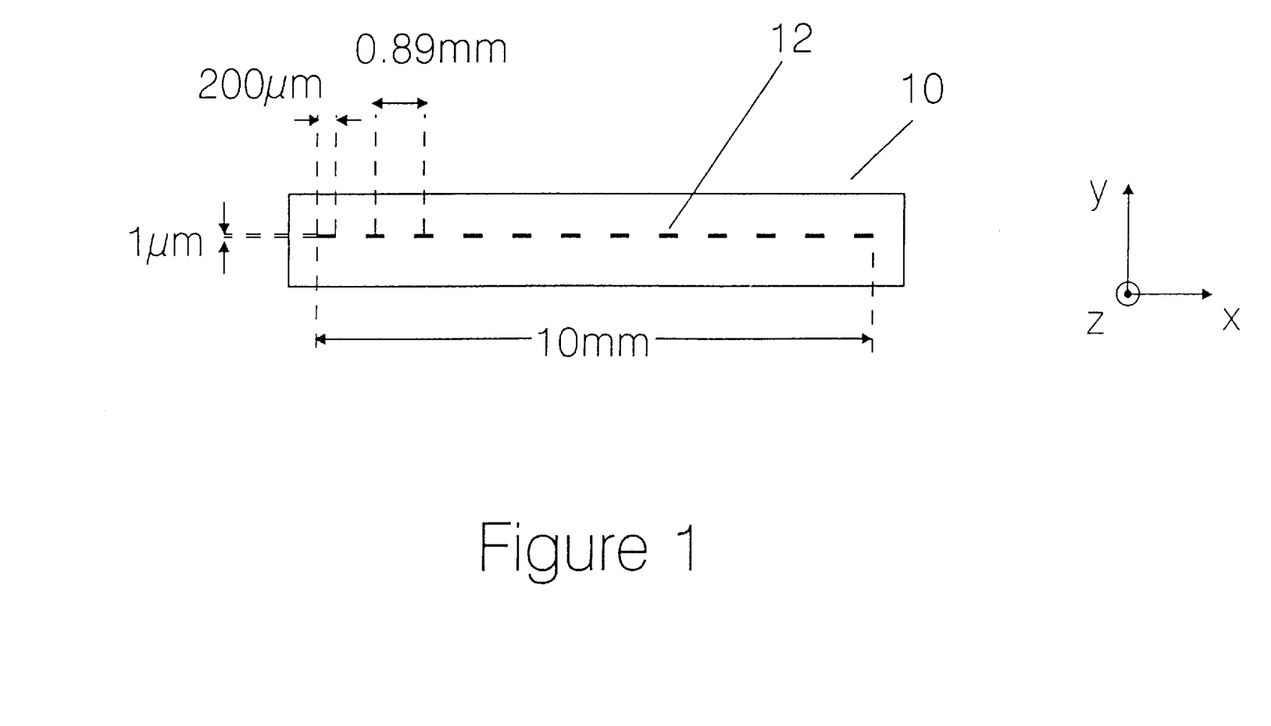
FIG. 1 is a schematic diagram of the emitting region of a diode bar laser.

For example, high power diode bars typically consist of a linear arrangement of lower power diode lasers, each of which may be a broad-stripe diode laser or may itself consist of a linear array of lower power diodes. FIG. 1 of the accompanying drawings is a schematic illustration of the emitting region of a typical 10 W (watts) diode bar 10. This consists of 12 individual diodes or diode arrays 12 with approximate transverse dimensions of 1 $\mu$m (micrometer) by 200 $\mu$m, and with a center-to-center spacing of approximately 0.89 mm (millimeter). The overall emitting dimensions are therefore approximately 1 $\mu$m by 10 mm, which results in a combined output beam which is highly elliptical. In this example, the output beam has a value of M$_x^2$ which is more than a thousand times greater than M$_y^2$.

A consequence of this dramatic difference between M$_x^2$ and M$_y^2$ is that when the output beam is focused with conventional optics, the minimum useful spot size in the x direction (i.e. parallel to the long axis of the diode bar array) is inconveniently large and can be typically about 40 times larger than the minimum useful spot diameter in the (almost diffraction-limited) y direction. This is a particularly undesirable feature which severely restricts the number of useful applications of high power diode lasers, such as longitudinal pumping of solid state laser oscillators or amplifiers.

Many techniques for collecting and subsequently focusing the output beam from a diode bar have been demonstrated for use in a variety of applications and in particular for end-pumping of solid-state lasers. Most of these techniques employ either an arrangement of cylindrical and spherical lenses (e.g. a system described in the article "High-Power Nd:YAG Laser End-Pumped by a cw, 10 mm×1 $\mu$m Aperture, 10 W Laser-Diode Bar" (Opt. Lett., 16, 318 (1991)), or involve coupling light from each emitting region into a respective optical fibre, the fibers subsequently being routed into a close-packed bundle (as described in the article "High-Power Nd:YLF Laser End-Pumped by a Diode-Laser Bar," Opt. Lett., 18, 1317 (1993)).

In both of these cases, the minimum average beam diameter which can be produced and maintained over a length of a few millimeters is relatively large (typically>1 mm). This relatively large average beam size is undesirable for many applications. For example, as mentioned above, in the case of longitudinal-pumping of solid-state lasers, the relatively large pump beam size has a detrimental effect on the laser gain and considerably limits the flexibility in the choice of resonator configuration and its modes of operation.

Another disadvantage of these previously proposed techniques is the power loss produced by the arrangement of focusing optics or fibers. Again, this reduces the usefulness of the devices in applications such as end-pumping or surgical treatment devices where a high power output is required.

SUMMARY OF THE INVENTION

This invention provides a beam shaping device for a laser device having a first beam quality factor M$_x^2$ in a first direction and a second beam quality factor M$_y^2$ in an orthogonal direction, the beam shaping device including at least one reflecting surface diverting at least a first part of the beam with respect to a second part of the beam to reconfigure at least one of the first and second beam qualities M$_x^2$ and M$_y^2$.

In the present invention a new beam shaping technique is described which can be used to re-configure the transverse spatial intensity profile of a laser beam such that the number of times by which a beam's divergence exceeds the diffraction limit in one plane (i.e. the $M^2$ value for that plane) can be reduced, and in the orthogonal plane can be increased, without a significant loss of power.

This technique has advantages over the previous techniques described above in that it can be of very simple construction and can provide effective control of the $M^2$ parameters of a laser beam in orthogonal planes, without necessarily significantly increasing the product of the $M^2$ values and without necessarily causing a significant loss of power. This renders the technique particularly attractive for use with lasers which produce beams with highly asymmetric diffraction properties (e.g. diode laser bars) where, for many applications, it is desirable to reconfigure the transverse intensity profile such that the final focused beam has a nearly circular spot with far field beam divergences, in orthogonal planes, which are similar (i.e. similar values for $M_x^2$ and $M_y^2$).

Preferably the device comprises a second reflecting surface, the first and second reflecting surfaces being substantially parallel to one another.

The term "substantially parallel" will be understood to encompass a nominally parallel relationship, up to about 5 degrees away from parallel.

Although the two reflecting surfaces could be formed on, for example, a single substrate, in a preferred embodiment, the first and second reflecting surfaces are each formed on a respective substrate. The use of an air gap between the two reflecting surfaces can reduce the device's losses.

Preferably the first and second reflecting surfaces are substantially planar.

It is preferred that the first and second reflecting surfaces are disposed with respect to one another to define a beam entry and a beam exit.

In a preferred embodiment, the product of $M_x^2$ and $M_y^2$ is substantially equal to the product of $(M_x^2)'$ and $(M_y^2)'$ for the reconfigured beam. This means that the reconfigured beam is similar in brightness to the input beam.

Also preferably $(M_x^2)'$ and $(M_y^2)'$ for the reconfigured beam are substantially equal. This means that the reconfigured beam is substantially symmetrical, and so is particularly suitable for use in the application identified above.

This invention also provides a laser source comprising a laser device having a beam with a first beam quality factor $M_x^2$ in a first direction and a second beam quality factor $M_y^2$ in a second direction, and a beam shaping device including at least one reflecting surface for diverting at least part of the beam to reconfigure at least one of the first and second beam qualities $M_x^2$ and $M_y^2$.

The invention is applicable to many different types of light source, but it is preferred that the laser device is a diode bar or a diode array.

In a preferred embodiment, the laser source further comprises an optical system for forming a round spot output beam from the reconfigured beam formed by the beam shaping device.

This invention also provides a laser system comprising the above laser source and a beam delivery system receiving the output of the laser source for delivering an application beam. A beam delivery system could include a multimode optical fibre.

Preferably the beam delivery system is a materials processing beam delivery system for delivering a materials processing application beam. Alternatively it is preferred that the beam delivery system is a medical beam delivery system for delivering a medical application beam. In either case, a beam delivery system could include a multimode optical fiber.

This invention also provides a diode pumped solid state laser system comprising the above laser source and a solid state laser for delivering an application beam, the output of the laser source pumping the solid state laser, preferably via a beam delivery system such as a multimode optical fiber. The solid state laser could be a bulk laser crystal, a waveguide laser, or a fiber laser.

This invention provides a beam shaping device for a laser device, the laser device having a beam with a beam quality factor $M_x^2$ in one direction and a beam quality factor $M_y^2$ in an orthogonal direction. The beam shaping device haves a plurality of substantially parallel reflecting surfaces defining a plurality of different propagation paths through the beam shaping device. Each path involving a respective different number of reflections between the reflecting surfaces. In use portions of an input beam from the laser device entering the beam shaping device follow respective different propagation paths and are reconfigured to form an output beam in which one of the beam quality factors $M_x^2$ and $M_y^2$ is decreased.

An embodiment of the invention will now be described, by way of example only, with reference to the accompanying drawings, throughout which like parts are referred to by like references, and in which:

DETAILED DESCRIPTION OF PREFERRED EMBODIMENTS

Figure 2:
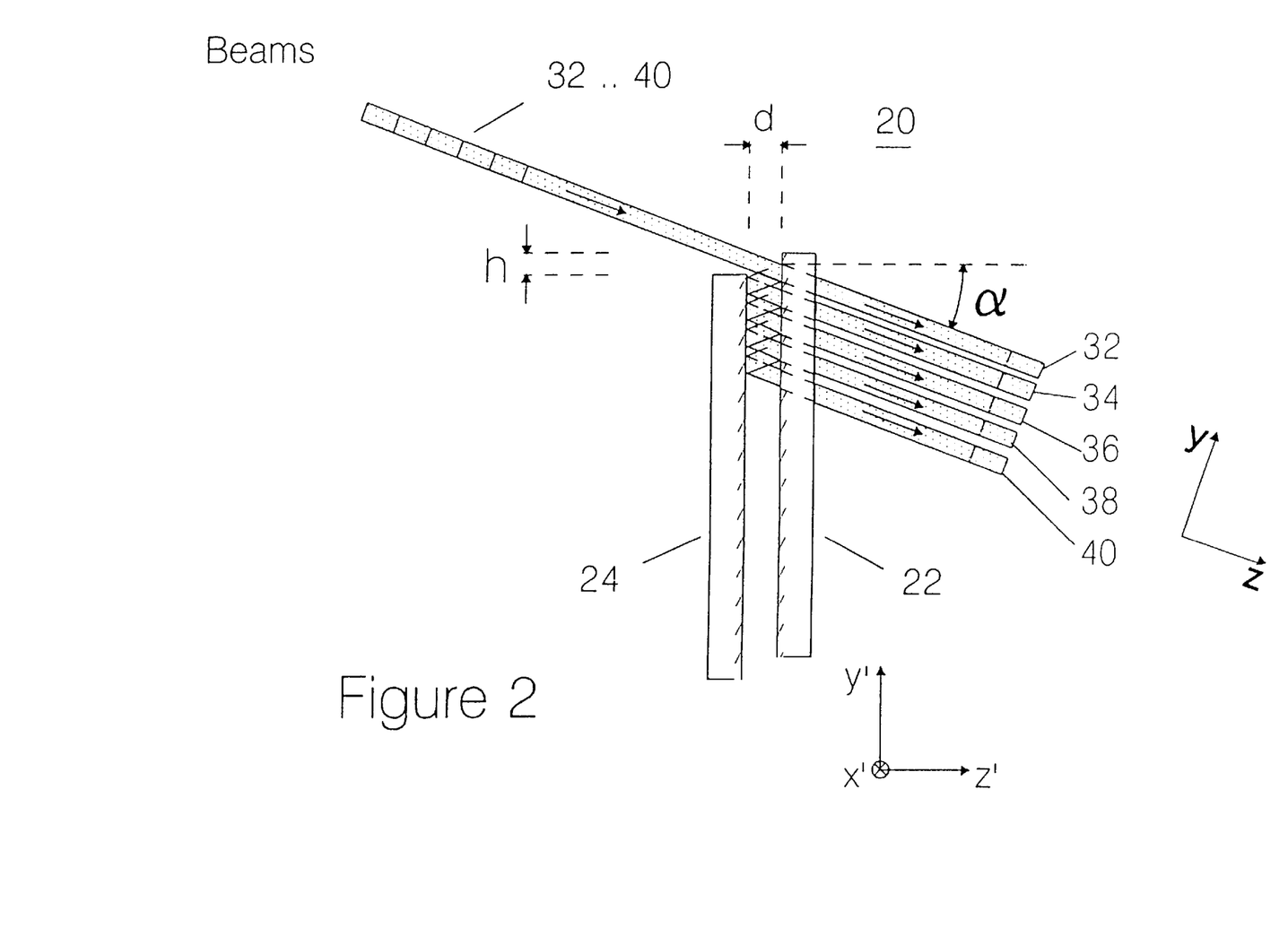
FIG. 2 is a schematic side view of a beam shaping device.
Figure 3:
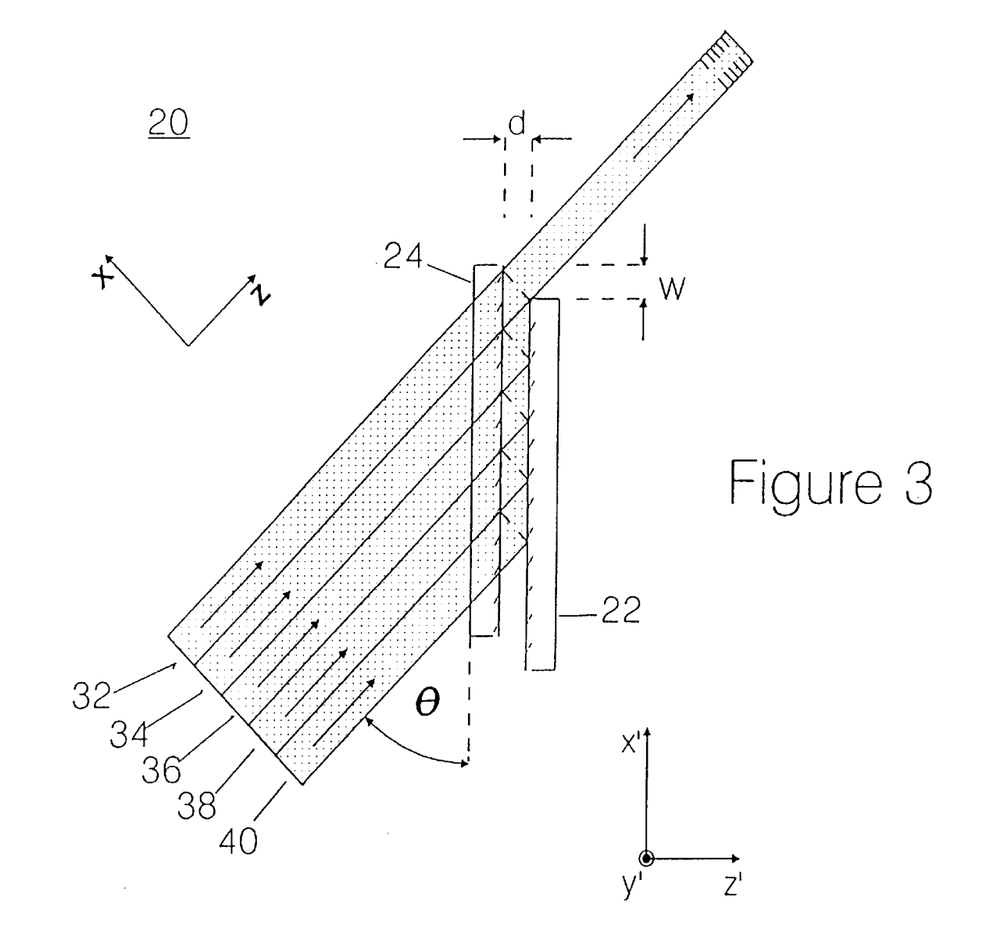
FIG. 3 is a schematic plan view of a beam shaping device.

With reference to FIGS. 2 and 3, laser radiation from a non-diffraction-limited laser source (not shown), is collected by an appropriate arrangement of lenses and prisms (also not shown) and is incident obliquely at angles θ and α in the orthogonal planes; x'-z' and y'-z' respectively, on a beam shaping device 20 (beam shaper), which comprises two highly reflecting mirrors 22, 24.

These mirrors are separated by a short distance d (typically less than a few millimeters e.g. micrometers to 5 millimeters) and are offset from one another by small distances w and h in the orthogonal directions x' and y' respectively, so that small sections of each mirror are not obscured by the other mirror. Example values of the dimensions d, w and h are given below.

The principle of operation of the beam shaping device can be simply explained by considering the incident laser beam to be comprised of (or divided into) a number of adjacent beams. For the purpose of simplifying the following explanation, the incident beam has been arbitrarily chosen to consist of five parallel beams or beam portions 32, 34, 36, 38, 40.

The beam 32 is not incident on either mirror 24, 22, since it passes above the mirror 24 (as shown in FIG. 2) and passes by the side of the mirror 22 (as shown in FIG. 3), and subsequently emerges from the beam shaper with no change to its original direction (assuming any diffraction effects at the edge of the mirror 22 are negligible). The beam 34, however, passes above the mirror 24 but is incident on the mirror 22 and is consequently reflected so that it strikes the mirror 24 immediately below the beam 32. The beam 34 is then reflected at the mirror 24 and emerges from the beam shaper in a direction approximately parallel to the beam 32, but is now displaced underneath the beam 32 (i.e. it is displaced from the beam 32 in a substantially orthogonal direction to its original displacement prior to entering the beam shaper).

The beam 36 is also first incident on the mirror 22, where it is reflected so that it strikes the mirror 24 underneath the beam 34. The beam 36 is then reflected so that it is incident on the mirror 22 for a second time, where it is reflected on to the mirror 24 and is subsequently reflected so that it emerges from the beam shaper substantially parallel to the beams 32 and 34 but displaced underneath the beam 34 in the orthogonal sense to its original displacement prior to entering the beam shaper.

The beams 38 and 40 undergo similar multiple reflections at the mirrors 22 and 24 and finally emerge from the beam shaper propagating in a direction approximately parallel to the beams 32, 34 and 36, but are now stacked underneath them (as shown in FIG. 2).

Thus the action of the beam shaping device is to effectively chop or divide the incident laser beam into a specific number of beams and then to reconfigure or rearrange the beams so that they emerge from the beam shaper stacked on top of one another (i.e. with substantially orthogonal displacements relative to their original displacements).

If the incident beam is initially many times diffraction-limited in the x-z plane (i.e. $M_x^2 \gg 1$), then the effect of the beam shaper is to decrease the width of the beam in the x direction, but without significantly increasing its divergence.

Thus the overall result is that the beam which emerges from the beam shaper exceeds the diffraction limit by a smaller factor in the x direction than the original beam (i.e. the value of $M_x^2$ is reduced).

For a given incident laser beam, the number of stacked beams and their widths (in the x-z plane) can be specified by the appropriate choice of angles $\theta$ and $\alpha$, mirror separation d and by appropriate positioning of the beam shaping device relative to the incident laser beam. Hence, the factor by which $M_x^2$ is reduced can be controlled by the appropriate adjustment of these beam shaping device parameters and the position of the beam shaping device relative to the incident beam.

It should be noted however, that a reduction in the value of $M_x^2$ is possible only if the $M_x^2$ value for the incident beam is significantly greater than one. If this is not the case, then the individual beams, into which the incident beam is chopped, will experience diffraction at the edge of the mirror 22 and the divergence will increase so that the final value for $M_x^2$ for the emerging beam is not less than unity. In the y direction the beam size is effectively increased (since the beams are stacked in this direction), but the divergence remains approximately constant (providing that mirrors 22 and 24 are parallel), hence the emerging beam has its $M_y^2$ value increased.

The factor by which $M_y^2$ is increased is approximately equal to the total width of the emerging beam (in the y direction) divided by the width of an individual beam (in the y direction). For many applications, it is desirable to minimize or reduce the increase in $M_y^2$ by choosing the values for the mirror spacing d, and the inclination angle $\alpha$ such that the gap between each pair of stacked beams is substantially minimized without significantly degrading the transmission of the beam shaper due to clipping of the beams at the top edge of mirror 24.

Thus the overall effect of the beam shaper is to re-configure the transverse intensity profile of a laser beam which is many times diffraction-limited in one plane, so that the number of times diffraction-limited for that plane is reduced and in the orthogonal plane is increased, without a significant loss of power.

The two mirrors 22, 24 are nominally aligned parallel to one another, but may if so required, be inclined slightly to one another (usually by no more than a few degrees e.g. up to 5 degrees) depending on the particular divergence characteristics of the incident laser beam, the design of the final focusing arrangement and the desired transverse intensity profile of the focused beam. By inclining the mirrors away from the parallel, the individual directions of the beams 32–40 can be modified to change the overall divergence of the output beam.

As a rough guide, the factor by which the $M^2$ value can be reduced is approximately equal to the number of beams which the incident beam is chopped into (providing that the incident beam is greater than this number of times diffraction-limited and that the emerging beams are of approximately equal width). In the orthogonal plane, the $M^2$ value is increased by at least the same factor. The emerging beam can then be simply focused by using an appropriate arrangement of lenses.

One of the particularly attractive features of this beam shaping technique, in addition to its overall simplicity, is that it can be used to transform the transverse intensity profile of a laser beam with highly asymmetric diffraction properties to one with nearly symmetrical diffraction properties (i.e. with values for $M^2$ in orthogonal planes which are approximately equal), and in so doing generate a laser beam which can readily be focused, with conventional optics (e.g. lenses and prisms), into a nearly circular spot with similar beam divergences in orthogonal planes—a requirement which is not only useful but often essential in some applications.

One particular area where this technique is envisaged to have a very important role is in re-configuring the spatial transverse intensity profile (i.e. beam shaping) of the laser beams from high power diode lasers and in particular, high power diode laser bars. These devices produce laser beams with highly asymmetric spatial properties and with $M^2$ values for orthogonal planes which may differ by over a thousand times.

For many applications of these devices it is advantageous, if not essential, to re-configure the laser beam so as to equalize (within, say, an order of magnitude) the values for $M^2$ for orthogonal planes (without significantly decreasing the overall brightness), so that the beam may be focused to a more circular spot, with similar beam divergence in orthogonal planes. The present technique is particularly well suited to this task. This is especially the case with laser sources (e.g. diode laser bars) which consist of an approximately linear array of smaller laser sources ('emitting regions') which are separated by non-emitting regions ('dead space'), since by choosing the appropriate arrangement of imaging lenses before the beam shaping device, and the appropriate parameters (i.e. w, h, d, θ and α) for the beam shaper (as shown in FIGS. 2 and 3) much or all of the 'dead space' can be effectively removed, and the $M^2$ value for the laser beam (in the plane parallel to the diode laser bar array) can be reduced very significantly.

An example of the use of the beam shaping technique with a typical high power diode laser bar will now be described with reference to the FIGS. 1, 4, 5(a), 5(b), 6 and 7.

As described above, FIG. 1 shows an end view of a typical diode laser bar 10, which consists of 12 emitting regions 12, with the laser output radiation propagating in the z direction.

Figure 4:
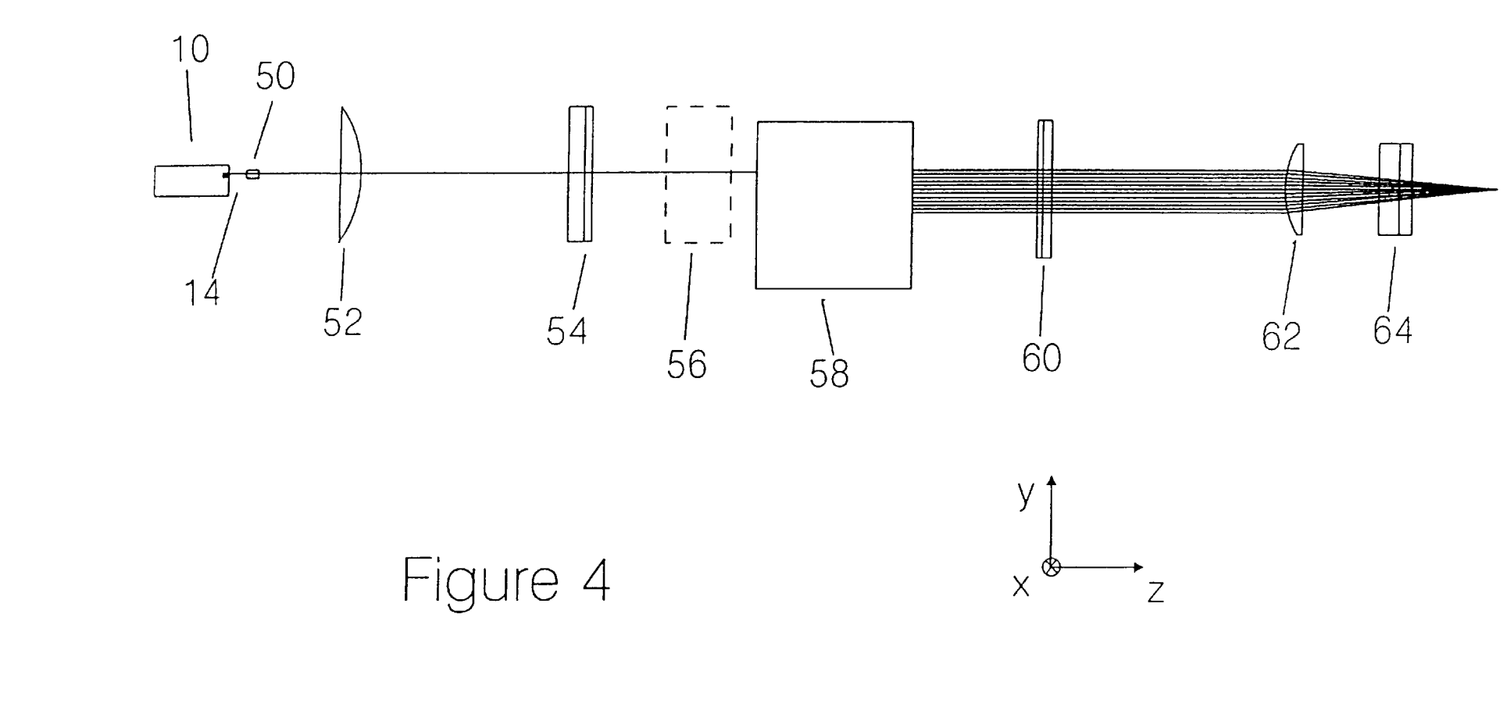
FIG. 4 is a schematic side view of collimating, imaging, beam shaping and focusing optics for the laser beam from a diode laser bar.
Figure 5A:
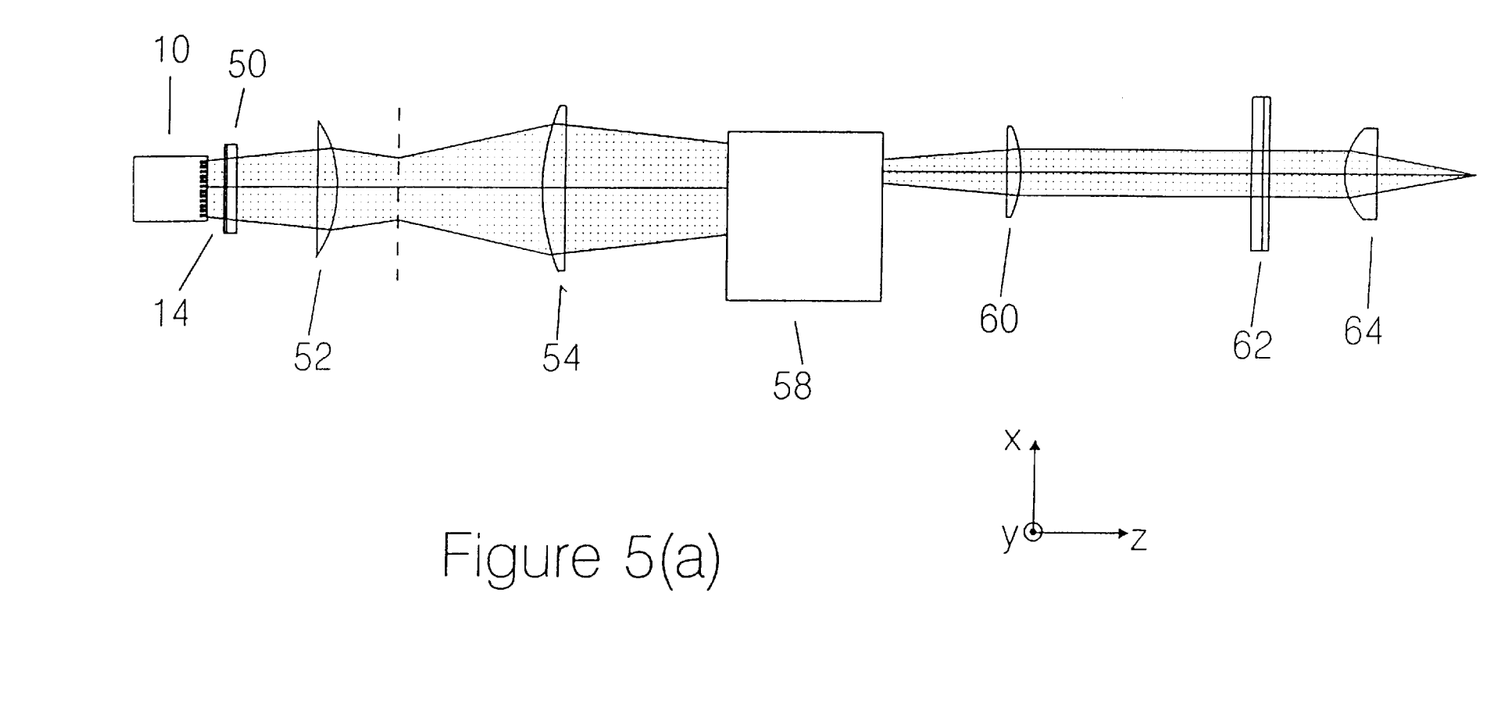
FIGS. 5(a) and 5(b) are schematic plan views of two respective embodiments of collimating, imaging, beam shaping and focusing optics for the laser beam from a diode laser bar.
Figure 5B:
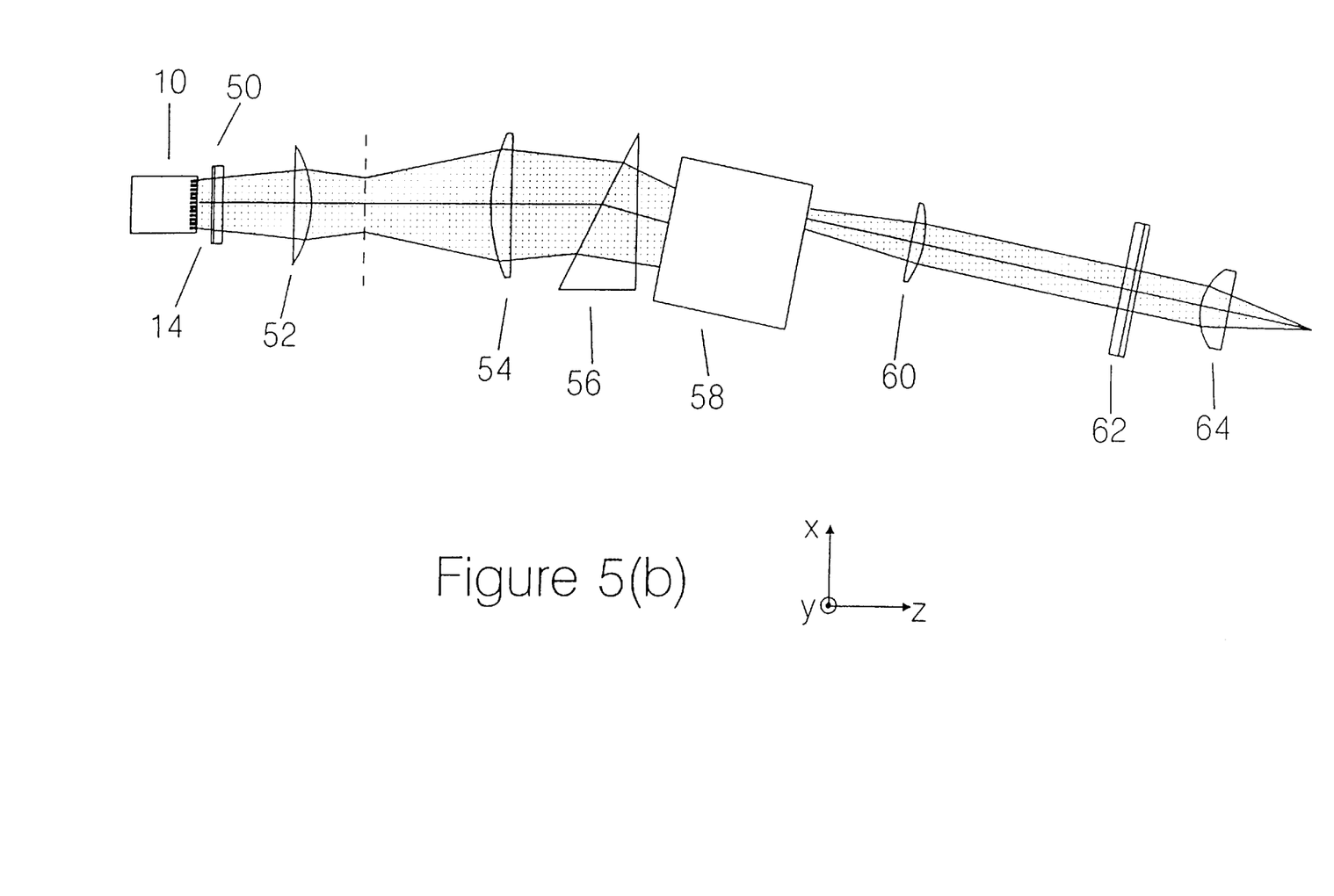

FIGS. 4, and 5(a), 5(b) show side and plan views of the collimating, imaging, beam shaping and focusing optics for the laser beam from a diode laser bar respectively.

Figure 6:
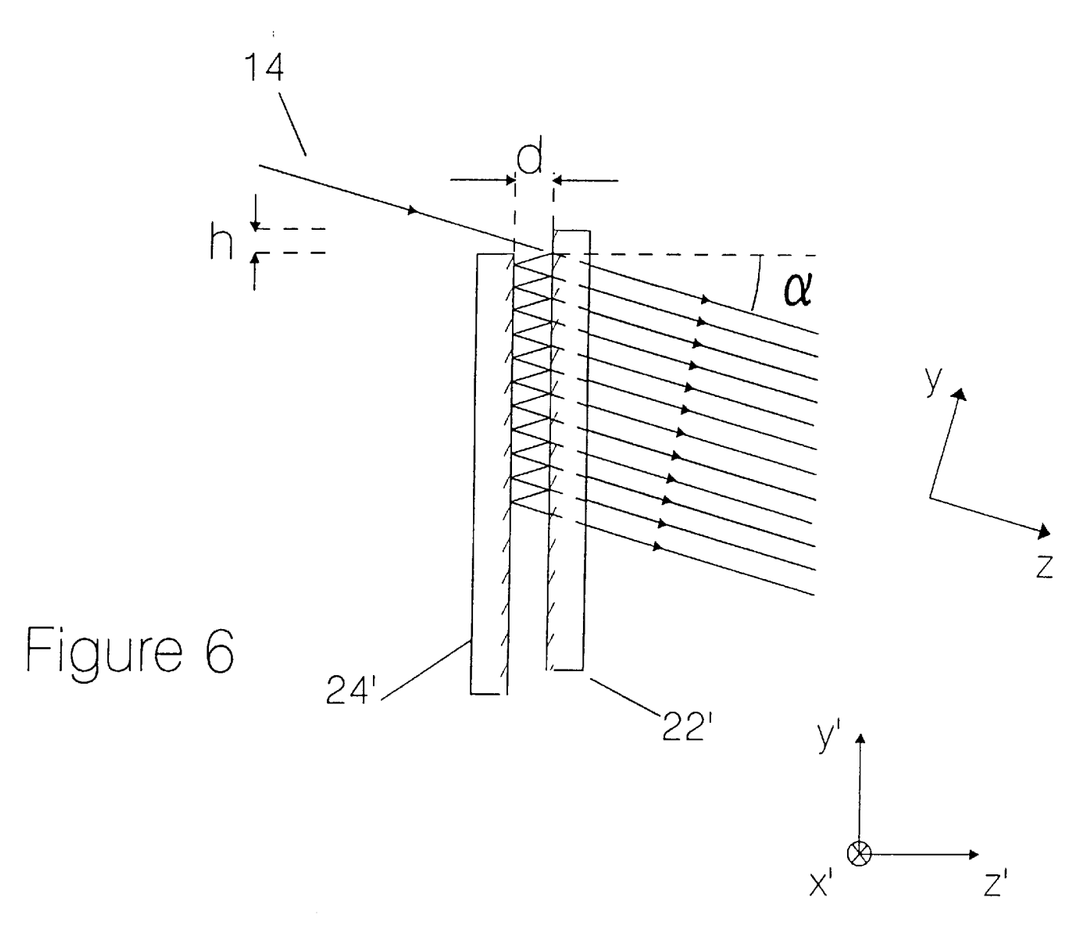
FIGS. 6 and 7 are further schematic side and plan views of the beam shaping device respectively.
Figure 7:
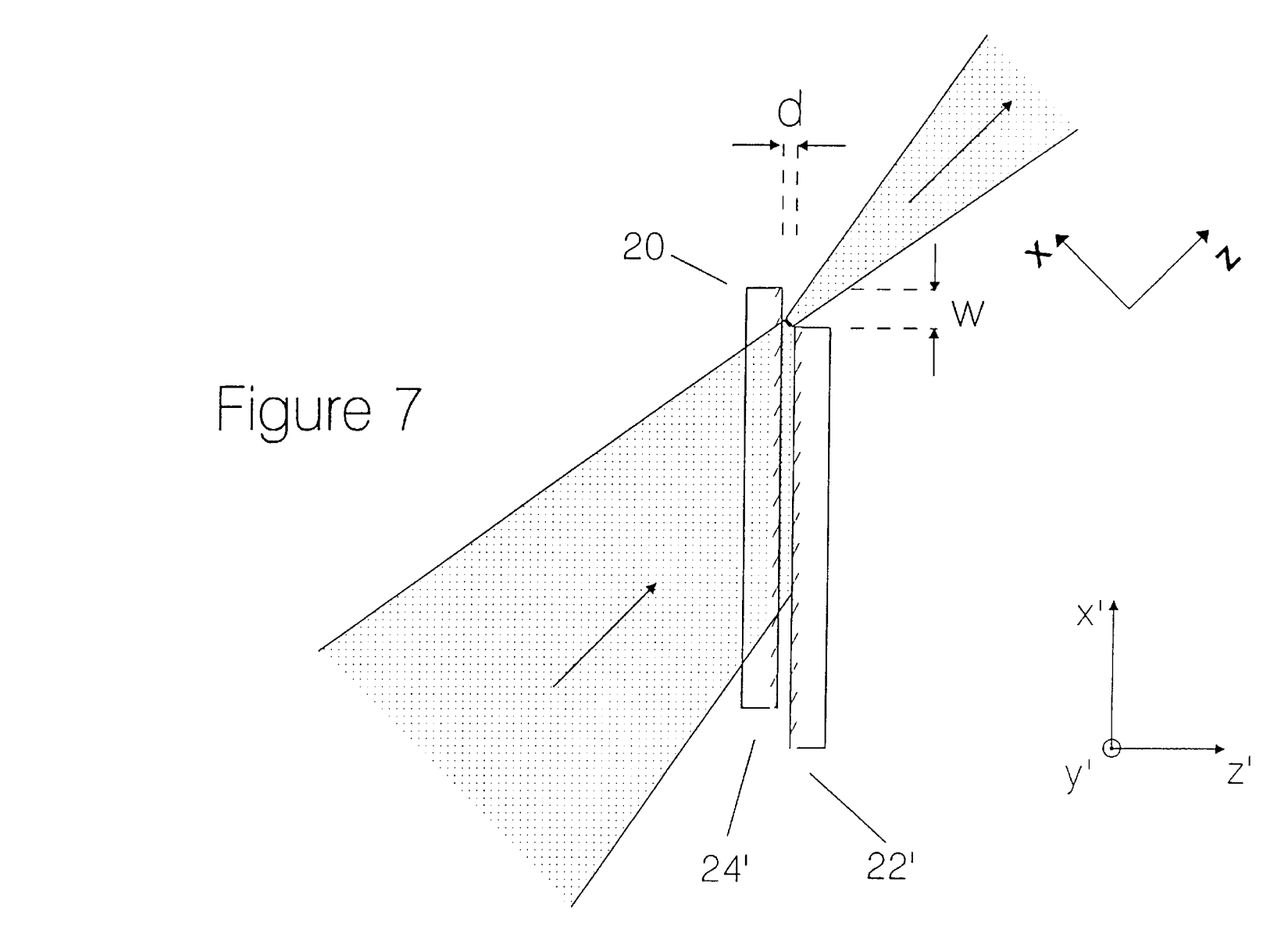
Figure 8A:
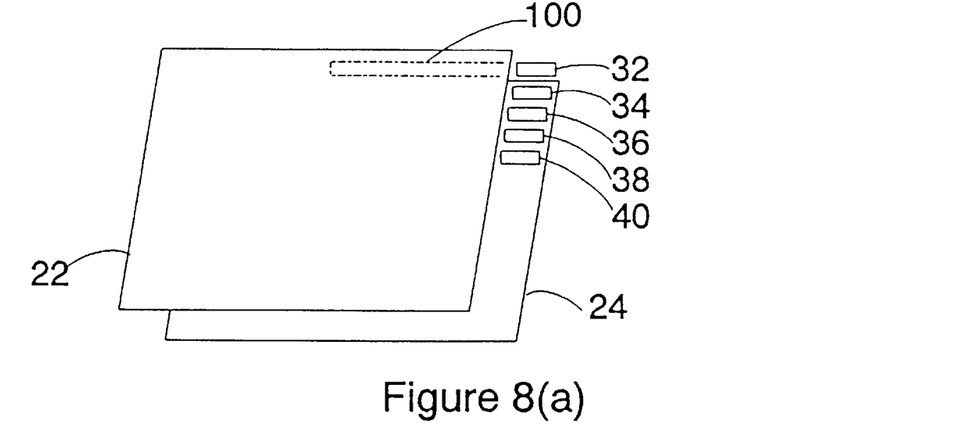
FIGS. 8A–8C are schematic side and plan views of a beam shaping device according to an embodiment of the present invention.
Figure 8B:
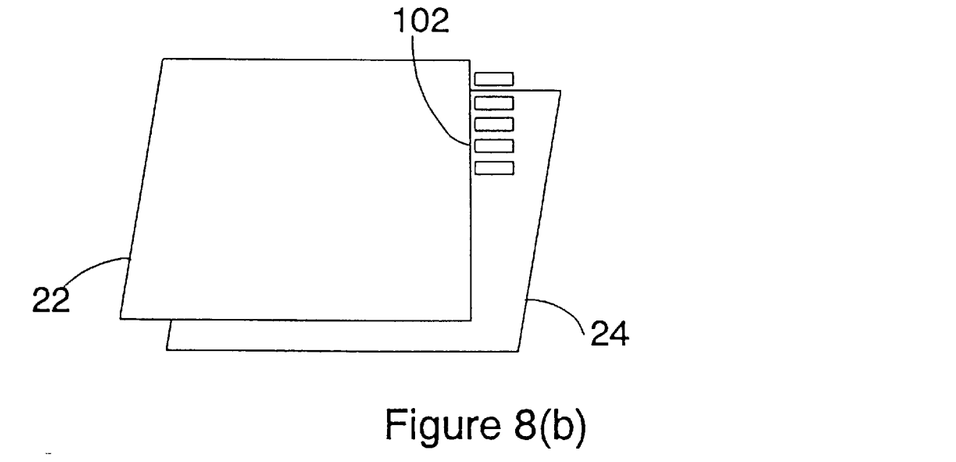
Figure 8C:
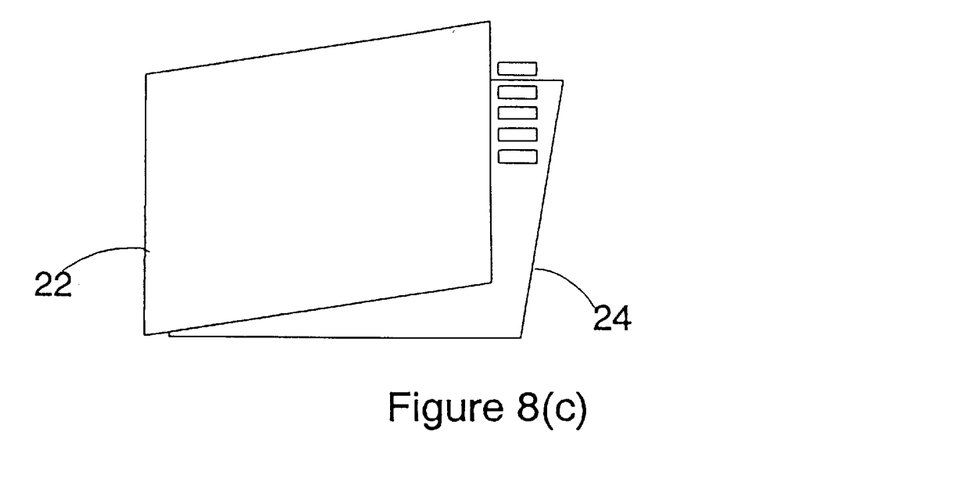

FIGS. 6 and 7 show side and plan views of the beam shaping device respectively.

With reference to FIGS. 1, 4, 5(a), 5(b), 6 and 7, laser radiation 14 from a diode laser bar 10 propagates in the z direction and is collected by a fibre lens 50, located very close to the diode bar, which serves to reduce the beam divergence in the y-z plane. The transmitted light is then incident on a plano-convex spherical lens 52 (in this case with a focal length of 40 mm) which is positioned at a distance approximately equal to its focal length from the diode laser bar. This lens approximately collimates the laser beams from each individual emitting region of the diode bar, which are then incident on a plano-convex cylindrical lens 54 of approximate focal length 100 mm and positioned at a distance approximately equal to the sum of its focal length and the focal length of the spherical lens 52 away from lens 52.

The transmitted beams are then focused (only in the x-z plane) to form an image of the diode bar which is approximately one focal length away from the lens. This image is magnified by a factor approximately equal to the ratio of the focal length of lenses 54 and 52 (i.e. in this case by a factor of about 2.5).

In the orthogonal y-z plane the beams are approximately collimated to a width of about 0.7 mm. For simplicity of the diagram, the beam shaping device is shown in FIGS. 4, 5(a) and 5(b) as a single discrete optical element 58 and is positioned close to the image in the focal plane of lens 54.

The beam shaping device is actually configured as shown in FIGS. 6 and 7, and consists of two parallel mirrors 22' and 24', which in this case are square with a side length of 50 mm. The precise shape and size of mirrors 22' and 24' is not a critical feature of the beam shaper design providing that they are large enough to accommodate the incident beam. One important aspect of the design however, is that the side edge of the mirror 22' and the top edge of the mirror 24' are approximately straight and well defined, and that the high reflectivity coating (in this case a multi-layer dielectric coating) is maintained up to the edge of the mirror.

In this particular example, the mirrors 22' and 24' are aligned parallel to each other and positioned, both relative to each other and as a combined unit, so that the image of the diode bar has its transverse intensity profile re-configured into 12 beams (one for each emitting region) which are stacked nearly vertically in the y-z plane. The choice of parameters; d, w, h, θ, and α required to achieve this depends on the design of the diode laser bar (i.e. the number and transverse dimensions of the emitting regions and their spacing) and on the design of the collection and imaging optics. In this particular case the desired change in the beam's transverse intensity profile was achieved with:

a mirror separation d of approximately 1.1 mm; and
inclination angles θ and α of approximately 45° and 20° respectively.

The mirror offset distances w and h were chosen to exceed the transverse width (in the x' direction) of the output beam at the mirror 24' and the depth (in the y' direction) of the incident beams at mirror 22'.

Typical values for w and h are 4 millimeters and 3 milimeters respectively.

One problem which may be encountered when the beam shaping technique is used to re-configure the beam from a diode laser bar in this fashion is cross-talk between adjacent emitting regions. This can occur if the laser beams from each emitting region overlap as the beams emerge from the beam shaper and is exacerbated by the fact that the laser beams from individual emitting regions travel different distances to the output of the beam shaping device. The laser beam which is not incident on either mirror 22' or 24' travels the least distance and laser beams which have more reflections at the beam shaper mirrors 22' and 24' travel progressively longer distances to the beam shaper exit.

The effect of cross-talk is to increase the $M^2$ value, in the x-z plane, for a particular output beam relative to its value without cross-talk. In some cases cross-talk may be avoided by suitable positioning of the beam shaper along the z-axis, but more generally it is advisable to include a prism 56 between the lens and the beam shaper (as shown in FIG. 5(b)) which is designed to equalise the effective optical paths (i.e. for diffraction in the x-z plane) of all the laser beams (i.e. from each emitting region) at the exit of the beam shaper. The net result is that the beam which emerges from the beam shaper has a value for $M^2$ in the x-z plane which is similar to that of an individual emitting region (array or broad-stripe) of the diode laser bar and is considerably smaller than the effective value of $M^2$ (in the x-z plane) for the diode laser bar as a whole. In the y-z plane, the $M^2$ value is increased by a factor which is approximately equal to the total width (in the y direction) of the output beam (i.e. the stack of beams) from the beam shaper divided by the width of an individual beam. For this particular optical arrangement the effective value for $M^2$ in the y-z plane is approximately 20.

The beam which emerges from the beam shaper consists of 12 parallel beams stacked (almost vertically) in the y-direction which propagate parallel to the z direction.

This beam is then incident on a plano-convex cylindrical lens 60 of focal length of about 80 mm, which serves to approximately collimate the beam in the x-z plane, and is then focused in both the y-z and x-z planes by a pair of crossed plano-convex cylindrical lenses 62 and 64 with focal lengths of 60 mm and 20 mm respectively.

The relative positions of these lenses along the z direction are such that the beam waists (in orthogonal y-z and x-z planes) are formed at approximately the same position. In this particular example, the resulting focused beam was found to have a minimum area spot of nearly circular cross-section with a diameter of approximately 130 μm.

Since the beam does not have equal $M^2$ values for orthogonal planes the beam divergence, and hence minimum average spot sizes for the x-z and y-z planes are different. For example, over a 3 mm path length in air, the average beam sizes in the y-z and x-z planes are 190 μm and 280 μm respectively, indicating that the corresponding values of $M^2$ are about 20 and about 40. Different values for the beam sizes can be obtained by the appropriate choice of focusing lenses.

The optical arrangement described here represents just one example, and there are actually many possible configurations of collecting/imaging optics and focusing optics which may be used depending on the particular laser source and the final application. In each case however, the essential feature is the beam shaping device itself, which consists of two, parallel or nearly parallel, reflecting surfaces (either separate mirrors or high reflectivity coatings on a single substrate), offset from one another and positioned with respect to the incident beam in such a way that adjacent sections of the incident beam are subject to a different number of multiple reflections between the reflecting surfaces, so that the transverse intensity profile of the beam is re-configured with a relative change in the $M^2$ values for orthogonal planes, and without a significant loss of power. In addition to diode laser bars, the technique may also be used with laser diode arrays, broad-stripe laser diodes, planar waveguides or any laser source which produces a non-diffraction-limited beam, where it is desirable to change the relative values for the $M^2$ parameter for orthogonal planes, without a significant loss of power.

The technique is also particularly well-suited to re-configuring the transverse intensity profile of laser sources (e.g. diode laser bars), which have highly asymmetric diffraction properties, where it is desirable to reduce this asymmetry so that the beam can be focused into a more circular spot with similar beam divergence in orthogonal planes.

This control of the transverse laser beam profile that this embodiment can provide is important for many applications, for example; longitudinal-pumping of solid-state laser oscillators and amplifiers (utilizing bulk or fibre geometries), materials processing and medical applications.

In addition, the beam shaper may also be used to modify the transverse intensity profile of the combined laser beams from a stack of diode laser bars or diode arrays (or indeed any other type of laser). In such a situation it is often the case that the distance between the individual lasers is much larger than their emitting region. By using the beam shaping device in reverse (i.e. propagating in the opposite direction to the one indicated in FIGS. 2 and 3 in conjunction with the appropriate collimating and focusing optics, the stack of beams can be re-configured into a single elongated beam, which can be subsequently re-configured with a second beam shaper (with different parameters; d and α and this time propagating in the same direction as FIGS. 2 and 3 into a stack of beams but now with a much closer spacing. Thus, in this way the effective brightness of the combined beams from each source can be increased significantly.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A beam shaping device for a laser device, the laser device having a beam with a first beam quality factor $M_x^2$ in a first direction and a second beam quality factor $M_y^2$ in an orthogonal direction, the beam shaping device including a first reflecting surface diverting at least a part of the beam in order to reconfigure at least one of the first and second beam quality factor $M_x^2$ and $M_y^2$, wherein one of $M_x^2$ and $M_y^2$ is decreased without substantial image rotation.

2. The beam shaping device of claim 1 further comprising a second reflecting surface, the first and second reflecting surfaces being substantially parallel to one another.

3. The beam shaping device of claim 2, wherein the first and second reflecting surfaces are each formed on a respective substrate.

4. The beam shaping device of claim 2, wherein the first and second reflecting surfaces are formed on opposite surfaces of a common substrate.

5. The beam shaping device of claim 2, wherein the first and second reflecting surfaces are substantially planar.

6. The beam shaping device of claim 2, wherein the first and second reflecting surfaces are disposed with respect to one another to define a beam entry and a beam exit.

7. The beam shaping device of claim 1, wherein the $M_x^2$ is greater than $M_y^2$.

8. The beam shaping device of claim 7, wherein the product of $M_x^2$ and $M_y^2$ is substantially equal to the product of $(M_x^2)'$ and $(M_y^2)'$ for the reconfigured beam.

9. The beam shaping device of claim 8, wherein $(M_x^2)'$ and $(M_y^2)'$ for the reconfigured beam are substantially equal.

10. A laser source comprising:
   a laser device, the laser device having a beam with a first beam quality factor $M_x^2$ in a first direction and a second beam quality factor $M_y^2$ in a second direction; and
   a beam shaping device including at least one reflecting surface for diverting at least part of the beam to reconfigure at least one of the first and second beam qualities $M_x^2$ and $M_y^2$, wherein one of $M_x^2$ and $M_y^2$ is decreased without substantial image rotation.

11. A beam shaping device for a laser device, the laser device having a beam with a beam quality factor $M_x^2$ in one direction and a beam quality factor $M_y^2$ in an orthogonal direction, the beam shaping device comprising:
   a plurality of substantially parallel reflecting surfaces defining a plurality of different propagation paths through the beam shaping device, each path involving a respective different number of reflections between the reflecting surfaces,
   collection optics for receiving the beam from the laser device and directing it towards the reflecting surfaces, and
   delivery optics for receiving an output beam from the reflecting surfaces,
   the reflecting surfaces being disposed with respect to one another and positioned with respect to the beam so that sections of each reflecting surface are not obscured by the other reflecting surface and wherein portions of an input beam from the laser device entering the beam shaping device follow respective different propagation paths and are reconfigured to form an output beam in which one of the beam quality factors $M_x^2$ and $M_y^2$ is decreased.

12. The beam shaping device of claim 11, wherein the propagation paths are laterally spaced at a beam entry of the beam shaping device and are substantially orthogonally spaced at a beam exit of the beam shaping device.

13. A laser source, comprising:
   a laser device, the laser device operable to generate a beam with a first beam quality factor $M_x^2$ in a first direction and a second beam quality factor $M_y^2$ in an orthogonal direction; and
   a beam shaping device having a plurality of substantially parallel reflecting surfaces defining a plurality of different propagation paths through the beam shaping device from a beam entry to a beam exit, each path involving a respective different number of reflections between the reflecting surfaces, the reflecting surfaces being disposed with respect to one another and positioned to receive the beam generated by the laser device so that sections of each reflecting surface are not obscured by the other reflecting surface, and wherein portions of an input beam from the laser device entering the beam shaping device at the beam entry follow respective different propagation paths and are reconfigured to form an output beam at the beam exit in which one of the beam quality factors $M_x^2$ and $M_y^2$ is decreased.

14. The laser source of claim 13, in which the reflecting surfaces are offset from one another in two orthogonal directions.

15. The laser source of claim 13, wherein the propagation paths are laterally spaced at the beam entry of the beam shaping device and are substantially orthogonally spaced at the beam exit of the beam shaping device.

16. The laser source of claim 13, wherein the reflecting surfaces are each formed on a respective substrate.

17. The laser source of claim 13, having two reflecting surfaces formed on opposite surfaces of a common substrate.

18. The laser source of claim 13, wherein the reflecting surfaces are substantially planar.

19. The laser source of claim 13, wherein $M_x^2$ is greater than $M_y^2$.

20. The laser source of claim 19, wherein the product of $M_x^2$ and $M_y^2$ in the beam generated by the laser device is substantially equal to the product of $(M_x^2)'$ and $(M_y^2)'$ for the output beam.

21. The laser source of claim 20, wherein $(M_x^2)'$ and $(M_y^2)'$ for the output beam are substantially equal.

22. A method for using a beam shaping device to reconfigure a laser beam having a beam quality factor $M_x^2$ in one direction and a beam quality factor $M_y^2$ in an orthogonal direction to form an output beam in which one of the beam quality factors $M_x^2$ and $M_y^2$ is decreased, the beam shaping device having a plurality of substantially parallel reflecting surfaces defining a plurality of different propagation paths through the beam shaping device, each path involving a respective different number of reflections between the reflecting surfaces; the method comprising:

disposing the reflecting surfaces with respect to one another and positioning the reflecting surfaces with respect to the laser beam so that sections of each reflecting surface are not obscured by the other reflecting surface and so that portions of an input beam from the laser device entering the beam shaping device at the beam entry follow respective different propagation paths and are reconfigured to form the output beam.

* * * * *